(12) United States Patent
Takeuchi et al.

(10) Patent No.: US 6,289,046 B1
(45) Date of Patent: Sep. 11, 2001

(54) ADAPTIVE EQUALIZATION METHOD

(75) Inventors: Sumitaka Takeuchi; Shuji Murakami, both of Tokyo; Hiroshi Ochi; Ken Onaga, both of Okinawa, all of (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/119,006

(22) Filed: Jul. 20, 1998

Related U.S. Application Data

(63) Continuation-in-part of application No. 09/006,498, filed on Jan. 14, 1998, now abandoned.

(30) Foreign Application Priority Data

Aug. 4, 1997 (JP) .................................................. 9-209504

(51) Int. Cl.$^7$ .............................................................. H03H 7/30
(52) U.S. Cl. .......................................... 375/232; 708/323
(58) Field of Search ...................................... 375/232, 230; 708/322, 323

(56) References Cited

U.S. PATENT DOCUMENTS

| | | |
|---|---|---|
| 5,063,573 | 11/1991 | Langewellpott . |
| 5,267,266 | 11/1993 | Chen . |
| 5,617,450 * | 4/1997 | Kakuichi et al. ..................... 375/230 |
| 5,694,474 * | 12/1997 | Ngo et al. .............................. 381/66 |
| 5,774,564 * | 6/1998 | Eguchi et al. ..................... 381/71.11 |

FOREIGN PATENT DOCUMENTS

| | | |
|---|---|---|
| 19519949C1 | 7/1996 | (DE) . |
| 0627136B1 | 11/1991 | (EP) . |
| 3-284014 | 12/1991 | (JP) . |

* cited by examiner

Primary Examiner—Stephen Chin
Assistant Examiner—Lenny Jiang
(74) Attorney, Agent, or Firm—Burns, Doane, Swecker & Mathis, LLP

(57) ABSTRACT

An adaptive equalization method updates the tap coefficient through utilization of the mean value of instantaneous gradient vectors, thereby ensuring the likelihood of pseudo transmission data that is generated from received data.

2 Claims, 12 Drawing Sheets

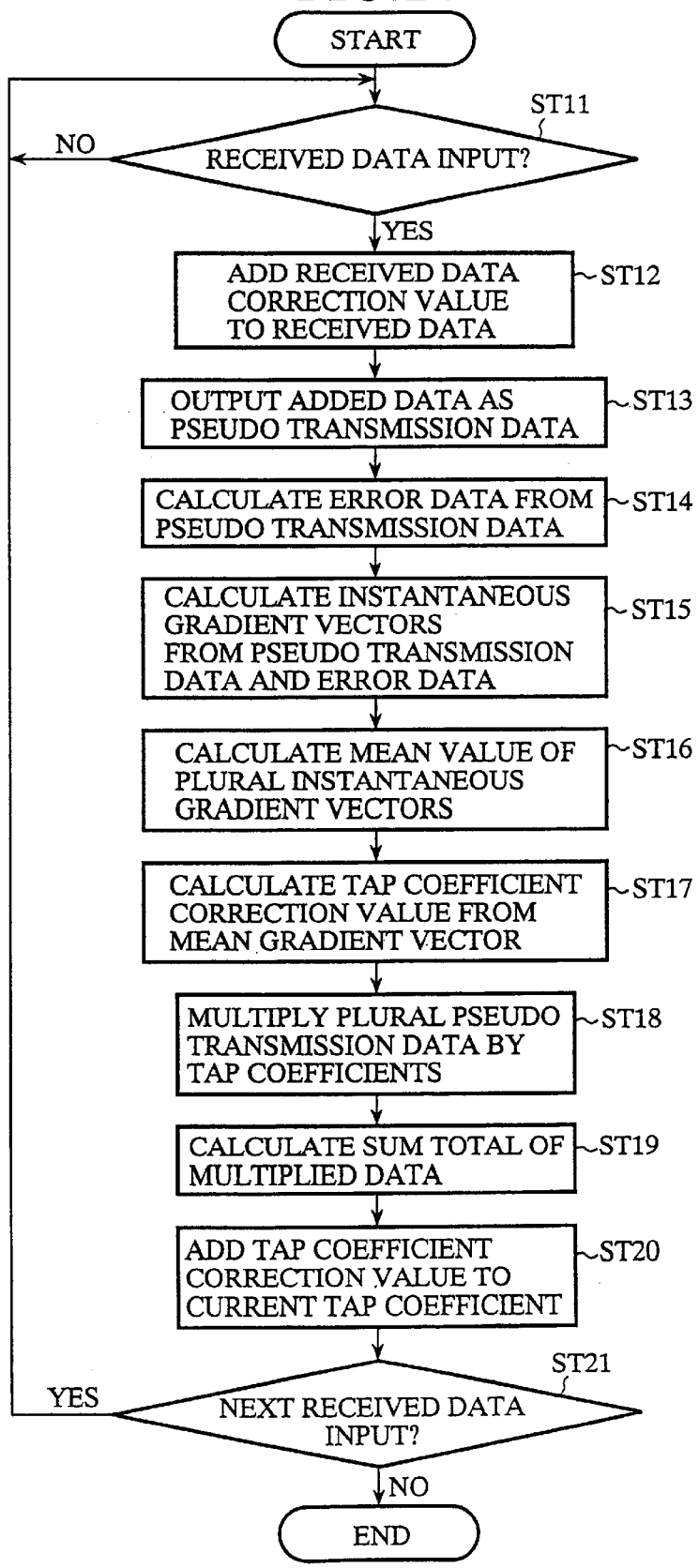

ADAPTIVE EQUALIZATION METHOD

This application is a continuation-in-part of Ser. No. 09/006,498, filed Jan. 14, 1998, now abandoned.

BACKGROUND OF THE INVENTION

1. Field of the Invention

The present invention relates to an adaptive equalization method applicable to a data transmission system which transmits a send signal, composed of plural pieces of data, from a transmitting to a receiving device over a transmission line. More particularly, the invention pertains to an adaptive equalization method which is used when the receiving device reconstructs or reproduces a pseudo send signal by removing signal distortion components (intersymbol interference) contained in the received signal due to various noise components and reflected waves,

2. Description of the Prior Art

FIG. 15 is a block diagram illustrating the configuration of a data transmission system employing a conventional adaptive equalization method. In FIG. 15, reference numeral 1 denotes a transmitting device, 2 a modulator placed in the transmitting device 1 to generate and output a send signal composed of plural pieces of transmission data, 4 a receiving device, 3 a transmission line for transmitting the send signal to the receiving device 4, 5' an adaptive equalizer placed in the receiving device 4 to estimate the send signal from the received signal sent over the transmission line 3 and output it as the above-mentioned pseudo send signal, and 6 a demodulator for demodulating the pseudo send signal to coding information.

The operation of the conventional data transmission system will be described below.

To begin with, in the transmitting device 1 the modulator 2 generates a send signal composed of plural pieces of data, from predetermined coding information, and outputs it. The send signal is transmitted over the transmission line 3 to and received by the receiving device 4. In the receiving device 4, the adaptive equalizer 5' reconstructs a pseudo send signal by removing various noise components and signal distortion components (intersymbol interference) contained in the received signal due to reflected waves or the like and then the demodulator 6 demodulates the pseudo send signal to obtain coding information.

in such a data transmission system, if the pseudo send signal output from the adaptive equalizer 5' corresponds exactly with the actual send signal output from the modulator 2, then the receiving device 4 can derive, from the pseudo send signal, coding information that matches the predetermined coding information of the transmitting device 2. On the other hand, if the pseudo send signal differs from the actual send signal, then the receiving device 4 will have erroneous coding information.

As described above, the adaptive equalizer 5' is used to reconstruct the send signal from the received signal, and hence it plays an important role in determining the likelihood of data in the data transmission system. The adaptive equalizer 5' will be described below in detail.

FIG. 16 illustrates in block form an example of the conventional adaptive equalizer 5'. Respective pieces of data of the received signal are sequentially input into the adaptive equalizer 5', which responds thereto to output respective pieces of data of the pseudo send signal one after another. In FIG. 16, reference numeral 211, . . . , 21N denote data holding means for holding plural pieces of received data input thereinto in the past; 220, . . . , 22N denote plural tap coefficient multiplying means which are each provided corresponding to one of the plural pieces of previously received data and newly received data, for multiplying the corresponding received data by a predetermined tap coefficient and outputting the multiplied data; 231, . . . , 23N denote adding means for adding together the plural pieces of multiplied data and outputting the added data; 24 and 25 denote error output means for outputting error data contained in the added data on the basis of decided values of the received data; 26 and 27 denote step size multiplying means for multiplying the error data by a step size and outputting a step value; 280, . . . , 28N denote instantaneous gradient calculating multipliers each for multiplying the corresponding step value and received data and outputting an instantaneous gradient value; and 360, ... , 36N and 350, . . . , 35N denote tap coefficient output means each for calculating, based on the corresponding instantaneous gradient value, a tap coefficient for use at the next received data input timing. The added data is output as pseudo send data based on the received data.

Such a configuration is commonly called an FIR (Finite impulse Response) filter. The adaptive equalizer has a circuit configuration based on the LMS (Least Mean Square) algorithm.

The tap coefficient thus obtained matches a tap coefficient obtainable with the following equation (3).

$$C(n+1)=C(n)+\mu \cdot \nabla(n) \qquad (3)$$

where $C(n+1)$ is a tap coefficient by which $(n+1)$th received data is multiplied, $C(n)$ a tap coefficient by which $(n)$th received data is multiplied, $\mu$ a step size, and $\nabla(n)$ a gradient vector based on the $(n)$th received data. In the LMS algorithm, the instantaneous gradient vector is calculated by the following equation (4).

$$\nabla(n)=e(n) \cdot x(n) \qquad (4)$$

where $e(n)$ is an error contained in $(n)$th pseudo transmission data and $x(n)$ is $(n)$th received data.

Because of such a configuration as mentioned above, the conventional adaptive equalizer has a problem that the mean square of errors contained in the pseudo transmission data is far larger than a mean square error contained in a Wiener solution that is considered to minimize it. And, an excess error that is obtained by subtracting the mean square error in the Wiener solution from the mean square error in the LMS algorithm constitutes a major factor in limiting the maximum likelihood of the pseudo send data in the LMS algorithm, degrading the equalization performance of the adaptive equalizer that utilizes the LMS algorithm.

incidentally, the Weiner solution needs to be calculated using the steepest descent method or the like, but arithmetic processing by the steepest descent method is required to use a gradient vector that is obtained by an expected value calculation; hence, the calculation of the Weiner solution involves the expected value calculation by a matrix such as an auto-correlation matrix or cross-correlation vector. In the actual calculation of the Weiner solution, it is necessary to use plural pieces of received data while at the same time repeating the expected value calculation by the matrix through the use of each received data, besides the number of received data for use in the expected value calculation steadily increases and the computational complexity of the expected value calculation increases at a geometric rate accordingly. Therefore, a circuit or program adapted to calculate the Weiner solution by the steepest descent method needs to perform very complex arithmetic processing of enormous amounts of data, and hence it has not been put to practical use. For reference purposes, an operation expression for the gradient vector by the Weiner solution is shown by the following equation (5).

$$\nabla(n)=E[e(n)\cdot x[n]] \quad (5)$$

where x[n] is a vector composed of plural pieces of received data that are input into the equalizer, e(n) is an error contained in the pseudo transmission data and E[·] means the expected value calculation.

For the reasons given above, it is impossible at present to implement adaptive equalization processing through utilization of the steepest descent method, and the adaptive equalization processing is now performed using the LMS algorithm easier to implement than the steepest descent method.

Next, a brief description will be given of the mean square error that arises excessively in the LMS algorithm. As will be seen from a comparison of Eqs. (2) and (3), the LMS algorithm can be considered as an algorithm for calculating the gradient vector by using the instantaneous value calculation as a substitute for the expected value calculation in the steepest descent method. Accordingly, letting the mean square error remaining in the Weiner solution be represented by Jmin, the excessively remaining mean square error Jex(LMS) (excess error) in the LMS algorithm can be given by the following equation (6):

$$J_{ex(LMS)}=\mu\cdot\text{trace}[R]\cdot J_{min} \quad (6)$$

where R is an auto-correlation matrix of received data and trace[R] is the sum of eigen values of the auto-correlation matrix.

SUMMARY OF THE INVENTION it is therefore an object of the present invention to provide a novel adaptive equalization method which permits generation of a pseudo send signal of fewer mean square errors than in the conventional adaptive equalization processing based on the LMS algorithm and which can be implemented on a practical circuit scale and by a practical number of arithmetic processing steps.

According to a first aspect of the present invention, there is provided an adaptive equalization method which generates, under the condition of L<D, (nD)th pseudo send data based on (nD)th received data x(nD) through (nD+D−1)th pseudo send data based on (nD+D−1)th received data x(nD+D−1) by using a tap coefficient C(nD) that is calculated by the following equation:

$$C(nD) = C(nD - D) + (\mu / L) \cdot \sum_{i=1}^{L} e(nD - i) \cdot x(nD - i) \quad (7)$$

where C(nD) and C(nD−D) are tap coefficients, n and D being integers equal to or greater than 1, $\mu$ is a step size (a real number), L is the number of data added (an integer equal to or greater than 2), e(nD−1) is an error contained in (nD−i)th pseudo transmission data and x(nD−i) is (nD−i)th received data.

Since the adaptive equalization method according to the first aspect of the invention generates (nD)th pseudo transmission data based on (nD)th received data x(nD) by using the tap coefficient calculated by Eq. (7), an excessive error contained in the pseudo transmission data concerned is 1/L which is contained in the pseudo transmission data based on the conventional LMS algorithm. Thus, it is possible to generate a pseudo send signal whose mean square error is smaller than in the pseudo send signal based on the conventional LMS algorithm.

As compared with the circuitry for the conventional LMS algorithm, the circuitry for implementing the adaptive equalization method according to the first aspect of the invention has, for each tap, a circuit for calculating the mean value of gradient values based on L instantaneous values; hence, the circuitry for this adaptive equalization method can be realized on a circuit scale (the number of steps) a little larger than the circuitry (program) based on the LMS algorithm. Accordingly, the adaptive equalization method according to the first aspect of the invention can be implemented on a practical circuit scale and by a practical number of arithmetic processing steps.

With the adaptive equalization method that utilizes this novel adaptive equalization algorithm, it is possible to generate a pseudo send signal containing fewer mean square errors than does the pseudo send signal based on the conventional LMS algorithm, and this can be achieved using a practical circuit configuration and a practical number of arithmetic processing steps.

According to a second aspect of the present invention, there is provided an adaptive equalization method which generates, under the condition of L>D, (nD)th pseudo transmission data based on (nD)th received data x(nD) to (nD+D−1)th pseudo transmission data based on (nD+D−1)th received data x(nD+D−1) by using a tap coefficient that is calculated by the following equation:

$$C(nD) = C(nD - D) + (\mu / L) \cdot \sum_{i=1}^{L} e(nD - i) \cdot x(nD - i) \quad (8)$$

where C(nD) and C(nD−D) are tap coefficients, n and [,] D being integers equal to or greater than 1, $\mu$ is the step size (a real number), L is the number of data added (an integer equal to or greater than 2), e(nD−i) is an error contained in (nD−i)th pseudo transmission data, and x(nD−1) is (nD−i)th received data.

The adaptive equalization method according to the second aspect of the invention also produces the same effects as are obtainable with the method according to the first aspect.

BRIEF DESCRIPTION OF THE DRAWINGS

Other object, features and advantages of the present invention will become more apparent from the following description taken in conjunction with the accompanying drawings.

FIG. 14 is a flowchart showing an adaptive equalization program according to Embodiment 6 of the present invention;

DETAILED DESCRIPTION OF THE PREFERRED EMBODIMENTS

With reference to the accompanying drawings, the preferred embodiments of the present invention will be described below in detail.

Embodiment 1

Figure 1:
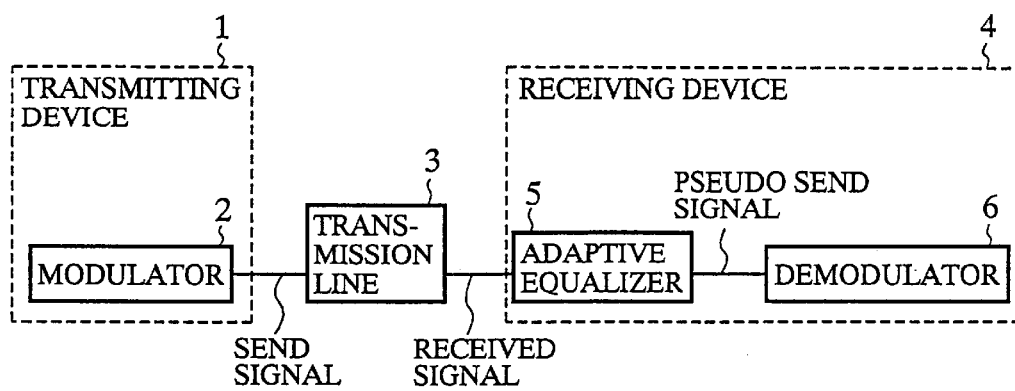
FIG. 1 is a block diagram illustrating the configuration of a data transmission system employing the adaptive equalization method according to Embodiment 1 of the present invention.

FIG. 1 illustrates in block form the configuration of a data transmission system employing the adaptive equalization method according to Embodiment 1 of the invention. In FIG. 1, reference numeral 1 denotes a transmitting device, 2 a modulator placed in the transmitting device 1 to generate and output a send signal composed of plural pieces of transmission data, 4 a receiving device, 3 a transmission line for transmitting the send signal to the receiving device 4, 5 an adaptive equalizer placed in the receiving device 4 to estimate the send signal from the received signal sent over the transmission line 3 and output it as the above-mentioned pseudo send signal, and 6 a demodulator for demodulating the pseudo send signal to coding information.

The operation of the conventional data transmission system will be described below.

To begin with, in the transmitting device 1 the modulator 2 generates a send signal composed of plural pieces of data, from predetermined coding information, and outputs it. The send signal is transmitted over the transmission line 3 to and received by the receiving device 4. In the receiving device 4, the adaptive equalizer 5 reconstructs a pseudo send signal by removing various noise components and signal distortion components (intersymbol interference) contained in the received signal due to reflected waves or the like and then the demodulator 6 demodulates the pseudo send signal to obtain coding information.

As described above, the data transmission system that embodies the adaptive equalization method according to Embodiment 1 uses the adaptive equalizer to eliminate from the received signal various noise components generated in the transmission line 3 and signal distortion components (intersymbol interference) due to reflected waves during propagation and reconstructs by the receiving device 4 the pseudo send signal which may preferably be identical with the send signal, ensuring efficient reception of highly reliable data.

Next, the adaptive equalizer 5 in embodiment 1 will be described.

Figure 2:
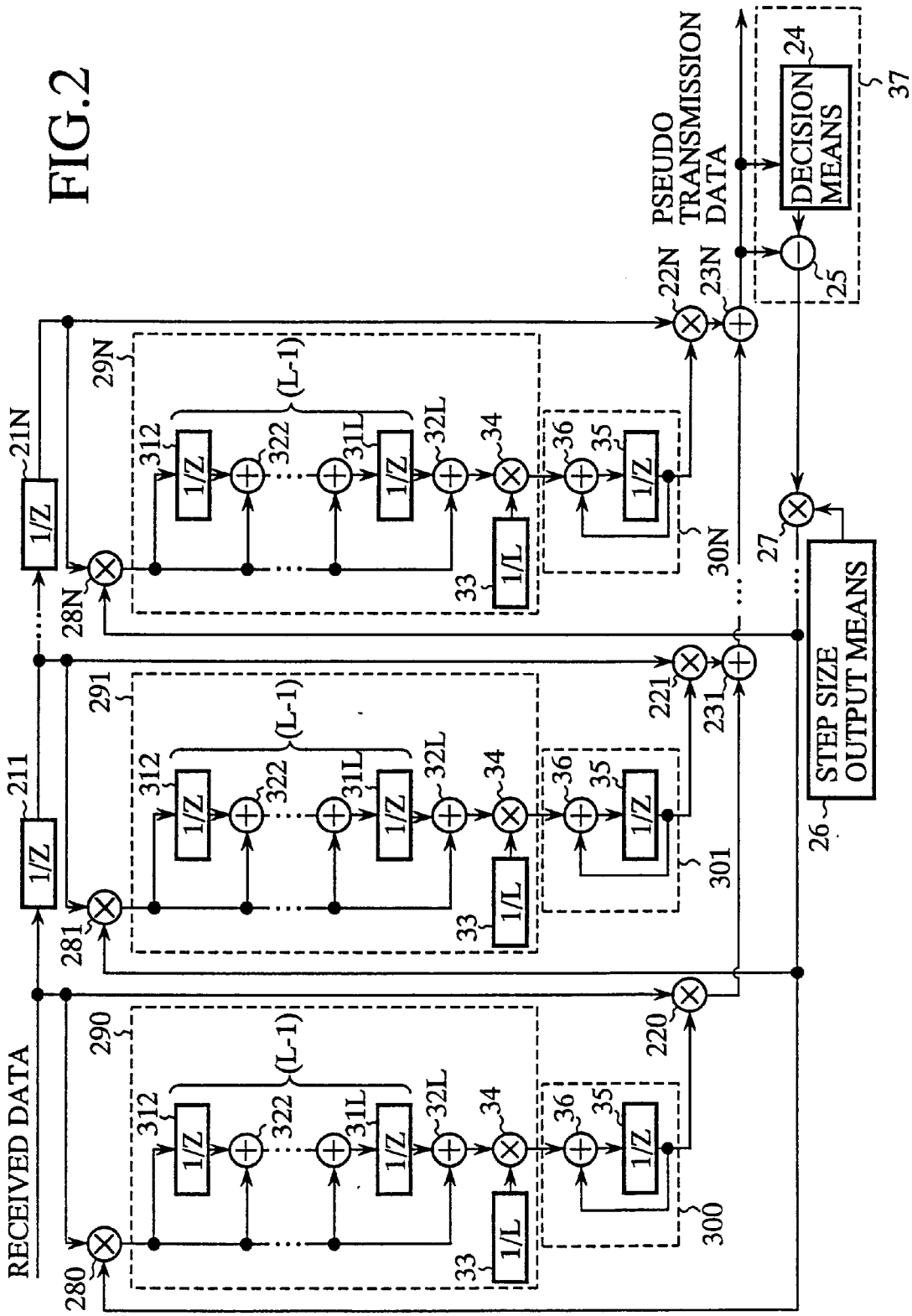
FIG. 2 is a block diagram illustrating the configuration of an adaptive equalizer according to Embodiment 1 of the present invention.

FIG. 2 illustrates in block form the construction of the adaptive equalizer 5. The adaptive equalizer 5 is one that is supplied with pieces of received data forming the received signal one by one and responds thereto to output pseudo signal data forming the pseudo send signal one by one, and the equalizer 5 is designed to perform a sequence of predetermined operations in synchronization with the input of the received data. In FIG. 2, reference numerals 211, ..., 21N denote received data delay lines each of which delays the received data input into the adaptive equalizer 5 by the input period of the received data; 220, ..., 22N denote tap coefficient multipliers each of which multiplies newly input received data or one of plural pieces of previous received data, provided from the delay lines 211, ..., 21N, by a predetermined tap coefficient and provides the multiplied output as multiplied data; 231, ..., 23N denote plural multiplied data adders each of which adds together the multiplied data fed thereto from two tap coefficient multipliers, the summed-up data being output from the final stage adder 23N; 24 denotes decision means which makes a soft decision or the like based on the summed-up data and outputs the decision data; 25 denotes a subtractor which calculates the difference between the decision data and the summed-up data and outputs the difference as error data; 26 denotes step size output means which outputs a step size that is used as the reference for correction of the tap coefficient; 27 denotes a multiplier which multiplies the step size and the error data and outputs the multiplied result as a step value; 280, ..., 28N denote instantaneous gradient calculating multipliers each of which multiplies the step value concerned and one of the received data to obtain an instantaneous gradient value; 290, ..., 29N denote mean gradient calculating means each of which calculates a mean gradient value of L (an integer equal to or greater than 2) instantaneous gradient values for each output from one of the multipliers 280, ..., 28N; and 300, ..., 30N denote tap coefficient calculating means each of which accumulates the mean gradient value for each output from one of the mean gradient calculating means 290, ..., 29N and outputs the accumulated value as a tap coefficient. The summed-up data is provided as received data to the demodulator 6.

The mean gradient calculating means 290, ..., 29N each comprise: (L-1) delay lines 312, ..., 31L for delaying data transmission by the input period of the received data ; (L-1) adders 322, ..., 32L each for adding the output from one of the delay lines 312, ..., 31L and the output from the instantaneous gradient calculating multiplier 280 (..., 28N); added gradient number output means 33 for outputting 1/L; and a mean gradient calculating multiplier 34 for multiplying the added gradient number output means 33 and the L-instantaneous gradient added value. The delay lines 312, ..., 31L and the adders 322, ..., 32L are alternately connected in series to form a ladder circuit. The output from the multiplier 280 (..., 28N) is fed to the ladder circuit, whose output is provided as and L-instantaneous gradient added value to the mean gradient calculating multiplier 34. The output from the multiplier 34 is applied as the mean gradient value to the tap coefficient calculating means 300, . . . , 30N.

The tap coefficient calculating means 300, . . . , 30N is each made up of one delay line 35 for delaying data transmission by the input period of the received data and a gradient adder 36 for adding the output from the delay line 35 and the above-mentioned mean gradient value. The output from the adder 36 is input into the delay line 35, whose output is provided as a tap coefficient to one of the tap coefficient multipliers 220, . . . , 22N.

Now, the operation of the adaptive equalizer 5 will be described as being performed at the timing of the input of n-th received data into the adaptive equalizer 5.

Upon input of the n-th received data into the adaptive equalizer 5, the received data delay lines 211, . . . , 21N output (n−1)th, (n−2)th, ..., first received data in order of input of the received data. And newly input n-th to zeroth received data are provided as received data to the tap coefficient multipliers 220, . . . , 22N and multiplied by tap coefficients, respectively. Accordingly, the plural multiplied data adders 231, . . . , 23N are supplied with multiplied data resulting from the multiplication of the n-th to zeroth received data by the tap coefficients, and the last-stage adder 23N outputs the sum total of the multiplied data. The thus obtained summed-up data is output from the adaptive equalizer 5 as n-th pseudo transmission data corresponding to the n-th received data.

Subsequent to the outputting of the pseudo transmission data, the adaptive equalizer 5 initiates an operation for updating the tap coefficients.

in the first place, the decision means 24 makes a soft or hard decision of the likelihood of the n-th pseudo transmission data and provides the decision result as decision data to the subtractor 25, which subtracts it from the n-th pseudo transmission data and provides the difference as error data to the multiplier 27. The multiplier 27 multiplies the error data by the step size from the step size output means 26 and outputs the step value, after which the instantaneous gradient calculating multipliers 280, . . . , 28N each multiply the step value and the received data and output an n-th instantaneous gradient value. The following equation (9) is a mathematical expression of the above arithmetic processing.

$$\nabla(n) = \mu \cdot e(n) \cdot x(n) \qquad (9)$$

where $\nabla(n)$ is an instantaneous gradient value based on the n-th received data, n is an integer, $\mu$ is the step size (a real number), e(n) is an error contained in the n-th received pseudo transmission data, and x(n) is n-th received data.

Next, the n-th instantaneous gradient value is provided to the ladder circuit of each of the mean gradient calculating means 290, . . . , 29N. At this timing, the delay lines 312, . . . , 31L forming the ladder circuit sequentially output an (n−1)th instantaneous gradient value, an added value of the (n−1)th and (n−2)th instantaneous gradient values, . . . , an added value of the (n−1)th to (n−L+1)th instantaneous gradient values. Hence, the gradient adder 32L of the last or terminating stage of the ladder circuit is supplied with the n-th instantaneous gradient value and the added value of the (n−1)th to (n−L+1)th instantaneous gradient values, and consequently, the added value of the nth to (n−L+1)th instantaneous gradient values is output from the adder 32L. The thus obtained added value and the 1/L output from the added gradient number output means 33 are input into the mean gradient calculating multiplier 34, from which is output the mean gradient value of the n-th to (n−L+1)th instantaneous gradient values. The following equation (10) is a mathematical expression of the above arithmetic processing.

$$\nabla ave(n) = (\mu/L) \cdot \sum_{i=0}^{L-1} e(n-i) \cdot x(n-i) \qquad (10)$$

where $\nabla ave(n)$ is an n-th mean gradient value, n an integer, $\mu$ is the step size (a real number), L is the number of data added (an integer equal to or greater than 2), e(n−i) is an error contained in an (n−i)th pseudo transmission data, and x(n−i) is (n−i)th received data.

Finally, the n-th mean gradient values are provided to the tap coefficient calculating means 300, . . . , 30N, respectively. At this timing, the delay line 36 of each tap coefficient calculating means outputs an n-th tap coefficient. Consequently, the gradient adder 36 of each tap coefficient calculating means newly outputs the tap coefficient given by the following equation (11):

$$C(n+1) = C(n) + (\mu/L) \cdot \sum_{i=0}^{L-1} e(n-i) \cdot x(n-i) \qquad (11)$$

where C(n) is a tap coefficient used to generate the n-th pseudo transmission data, n is an integer, $\mu$ is the step size (an integer), L is the number of data added (an integer equal to or greater than 2), e(n−i) is an error contained in (n−i)th pseudo transmission data, and x(n−i) is (n−i)th received data.

Since the tap coefficient is updated upon each input of the received data as described above, the difference between the pseudo transmission data from the subtractor 25 and the decision data gradually decreases and the likelihood of the pseudo transmission data grows correspondingly.

Figure 3:
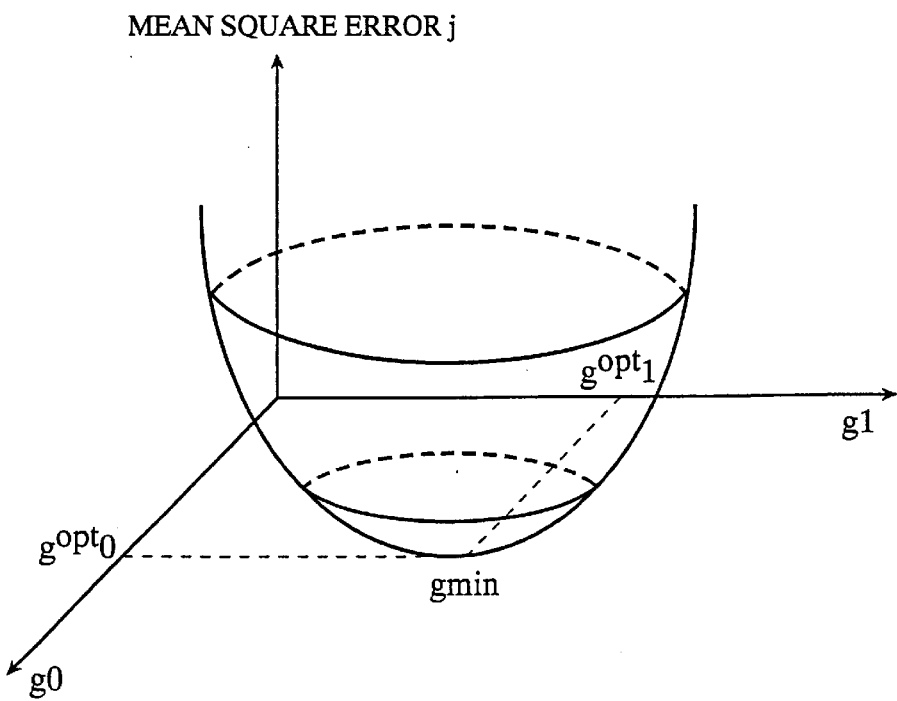
FIG. 3 is a perspective view of a mean square error space for explaining the equalization performance of the adaptive equalizer according to Embodiment 1 of the present invention.

Next, a brief description will be given of the reason for which the likelihood of the pseudo transmission data gradually increases as such updating of the tap coefficient is repeated. FIG. 3 is a perspective view of the curved surface of the mean square error on the assumption that the number of taps is 2 (i.e. only the taps of the multipliers 280 and 281 in FIG. 2) when the criterion in the decision means 24 is a decision that minimizes the mean square error. In FIG. 3, the ordinate represents the magnitude or value of the mean square error, g0 and g1 axes represent respective tap coefficient values, gmin represents the minimum mean square error in the case of the Weiner solution, and gopt0 and gopt1 represent respective tap coefficient values in the Weiner solution. The decision means outputs the decision data so that each tap coefficient approaches the Weiner solution. As a result, the tap coefficient moves along the curved surface of a shape like the bottom of a pan and, ideally, it converges to a tap coefficient that reaches the Weiner solution. By this, the likelihood of received data increases.

As is evident from the above, it is possible to obtain a solution close to the Weiner solution by updating the tap coefficient a certain number of times; hence, the tap coefficient updating operation need not be performed for the entire received data and the number of times the updating is performed can suitably be set in accordance with assumed characteristics of the transmission line 3 or allowed likelihood of pseudo transmission data.

Finally, a description will be made of the means square error that excessively arises in Embodiment 1. Letting the mean square error remaining in the Weiner solution be represented by Jmin, a mean square error Jex(LMS) (an excess error) that excessively remains in the LMS algorithm can be given as follows;

$$Jex(LMS) = {}^*\mu/L) \cdot \text{trace}[R] \cdot Jmin$$

where R is an auto-correlation matrix of received data, trace[R] is the sum of eigne values of the auto-correlation matrix, and L is the number of data added (an integer equal to or greater than 2).

As described above, according to Embodiment 1, since (n+1)th pseudo transmission data based on (n+1)th received data x(n+1) is generated using the tap coefficient C(n+l) obtained by Eq. (11), the excess error that is contained in the pseudo transmission data is 1/L (where L is an integer equal to or greater than 1) that contained in the pseudo transmission data based on the conventional LMS algorithm. Thus, it is possible to create a pseudo send signal that contains mean square errors fewer than those in the pseudo send signal based on the conventional LMS algorithm.

The circuitry of the adaptive equalizer according to Embodiment 1 differs from the circuitry for the conventional LMS algorithm only in that the former has, for each tap, a circuit for calculating the mean value of gradient vectors based on L instantaneous values; therefore, the adaptive equalizer can be implemented on a circuit scale a little larger than that of the circuitry based on the LMS algorithm, that is, on a practical circuit scale.

Hence, the adaptive equalizer according to Embodiment 1 will enhance the quality of data when employed in a data transmission system or receiving device.

Figure 4:
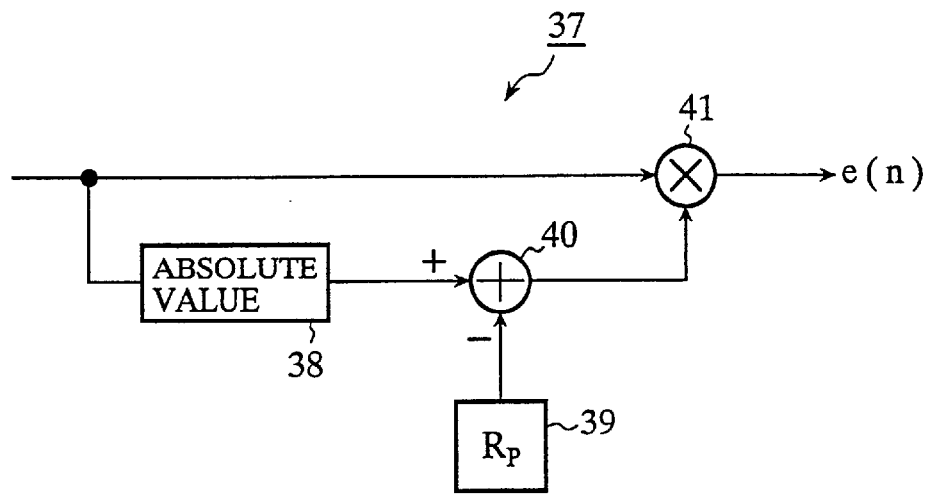
FIG. 4 is a block diagram showing the configuration of a modified form of error output means according to Embodiment 1 of the present invention.

While in Embodiment 1 the error output means 37 has been described to be formed by the decision means 24 and the subtractor 25, it may be configured based on a constant modulus algorithm as shown in FIG. 4. With such a configuration, too, the error output means 37 makes the same decision as mentioned previously, based on pseudo transmission data and outputs the error data. In FIG. 4, reference numeral 38 denotes an absolute value decision means which outputs the absolute value of the pseudo transmission data, 39 a constant output means which outputs a constant Rp required by the algorithm, 40 a subtractor which subtracts the multiplicator concerned from the absolute value, and 41 a multiplier which multiplies the pseudo transmission data by the output from the subtractor 40, the multiplied value being output as error data. The above-mentioned constant Rp is obtainable from ideal transmission data and the error data that is output from the subtractor 41 takes a value corresponding to the error ratio of the pseudo transmission data to the ideal transmission data concerned.

Figure 5:
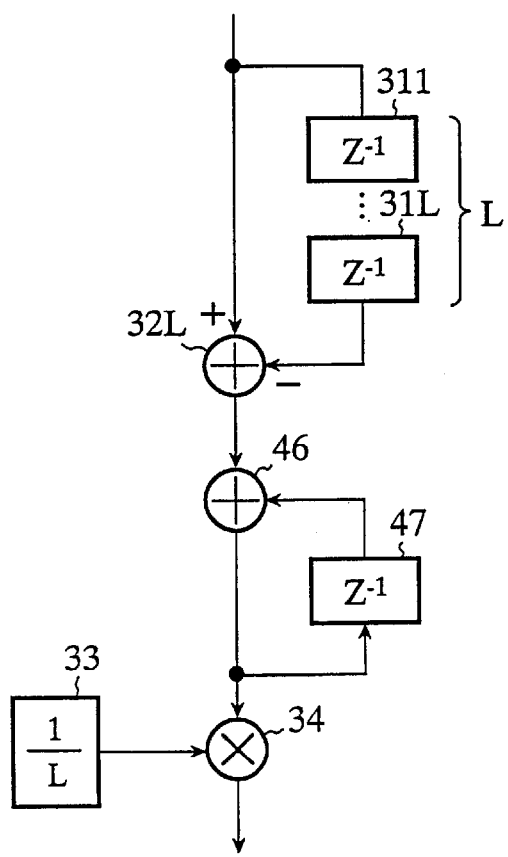
FIG. 5 is a block diagram showing the configuration of a modified form of a tap coefficient calculating system according to Embodiment 1 of the present invention.

FIG. 5 illustrates in block form a modification of the mean gradient calculating means 29 that is used to obtain from received and error data in Embodiment 1. With the illustrated configuration, too, the mean gradient can similarly be obtained from the received and the error data. In FIG. 5, reference numerals 311 to 31L denote L series-connected delay lines for delaying the instantaneous gradient value from the multiplier 28 by the time interval corresponding to the input periods of L received data, 32L a subtractor by which the delayed instantaneous gradient value from the last delay line 31L is subtracted from an instantaneous gradient value that is newly output from the multiplier 28, 47 a delay line for delaying the output from the subtractor 32L by one received data input period, 46 an adder by which the subtracted output newly provided from the subtractor 32L is added to the previous subtracted output delayed by the delay line 47, 33 added gradient number output means which outputs 1/L, and 34 a means gradient calculating multiplier for multiplying the outputs from the added gradient number output means 33 and the adder 46. The output from the multiplier 34 is provided as the means gradient value. Incidentally, the circuit of FIG. 5 conducts the arithmetic operation expressed by the following equation (13). The circuit configuration of FIG. 5 permits reduction of the circuit scale of the entire system more than the circuit configuration depicted in FIG. 2.

$$C(n+1) = C(n) + (\mu/L) \cdot \sum_{i=0}^{n} \{e(i) \cdot x(i) - e(i-L) \cdot x(i-L)\} \quad (13)$$

where C(n+1) and C(n) are tap coefficients used to generate n-th pseudo transmission data, n is an integer, $\mu$ is the step size (a real number), L is the number of data added (an integer equal to or greater than 2), e(n) is an error contained in n-th pseudo transmission data, and x(n) is n-th received data.

Embodiment 2

Figure 6:
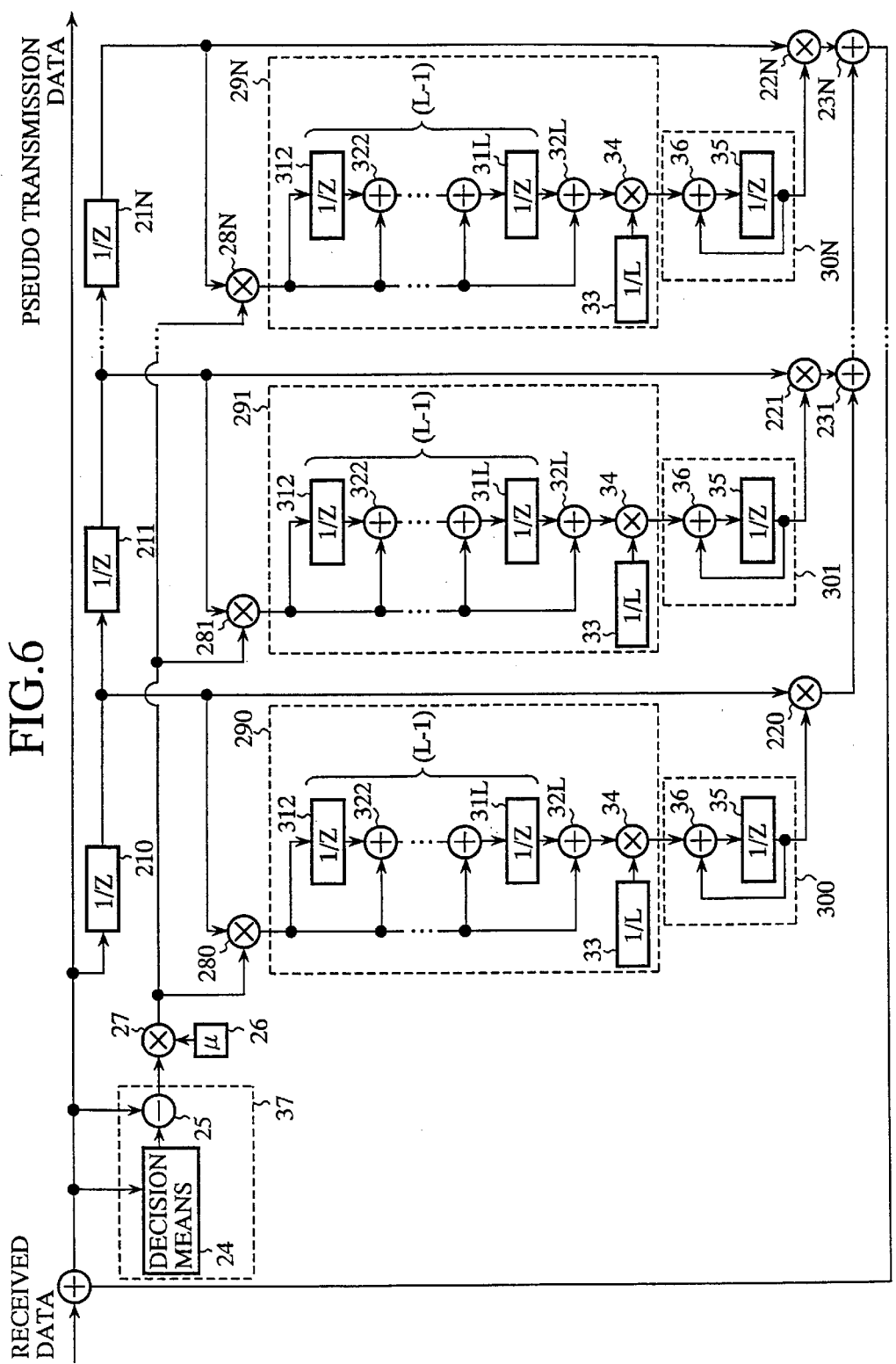
FIG. 6 is a block diagram illustrating the configuration of an adaptive equalizer according to Embodiment 2 of the present invention.

FIG. 6 illustrates in block form the configuration of an adaptive equalizer according to Embodiment 2 of the present invention. In FIG. 6, reference numeral 41 denotes an adder which adds a received data correction value to received data and outputs corrected received data, which is output as pseudo transmission data. Reference numeral 210 denotes a delay line for delaying the pseudo transmission data by the input period of the received data. The output from the delay line 210 is input, as a substitute for the received data, into the delay line 211 and the output from the multiplied data adder 23N of the last stage is input as the aforementioned received data correction value to the adder 41. The adaptive equalizer according to Embodiment 2 is identical in construction with the equalizer according to Embodiment 1 except the above.

With such a configuration, too, it is possible to obtain the tap coefficient given by Eq. (11), by which the n-th received data correction value interpolates the characteristic of the transmission line 3 on the basis of the n-th pseudo transmission data. Hence, the likelihood of the pseudo transmission data gradually increases.

As described above, according to Embodiment 2, since the (n+1)th pseudo transmission data based on the (n+1)th received data x(n+1) is generated using the tap coefficient C(n+1) calculated from Eq. (11), the excess error contained in the pseudo transmission data is 1/L (where L is an integer equal to or greater than 2) that contained in the pseudo transmission data based on the conventional LMS algorithm as indicated by Eq. (12). Thus, it is possible to create a pseudo send signal that contains mean square errors fewer than those in the pseudo send signal based on the conventional LMS algorithm.

The circuitry of the adaptive equalizer according to Embodiment 1 differs from the circuitry for the conventional LMS algorithm only in that the former has, for each tap, a circuit for calculating the mean value of gradient vectors based on L instantaneous values; therefore, the adaptive equalizer can be implemented on a circuit scale a little larger than that of the circuitry based on the LMS algorithm, that is, on a practical circuit scale.

Hence, the adaptive equalizer according to Embodiment 2 will enhance the quality of data when employed in a data transmission system or receiving device.

Embodiment 3

Figure 7:
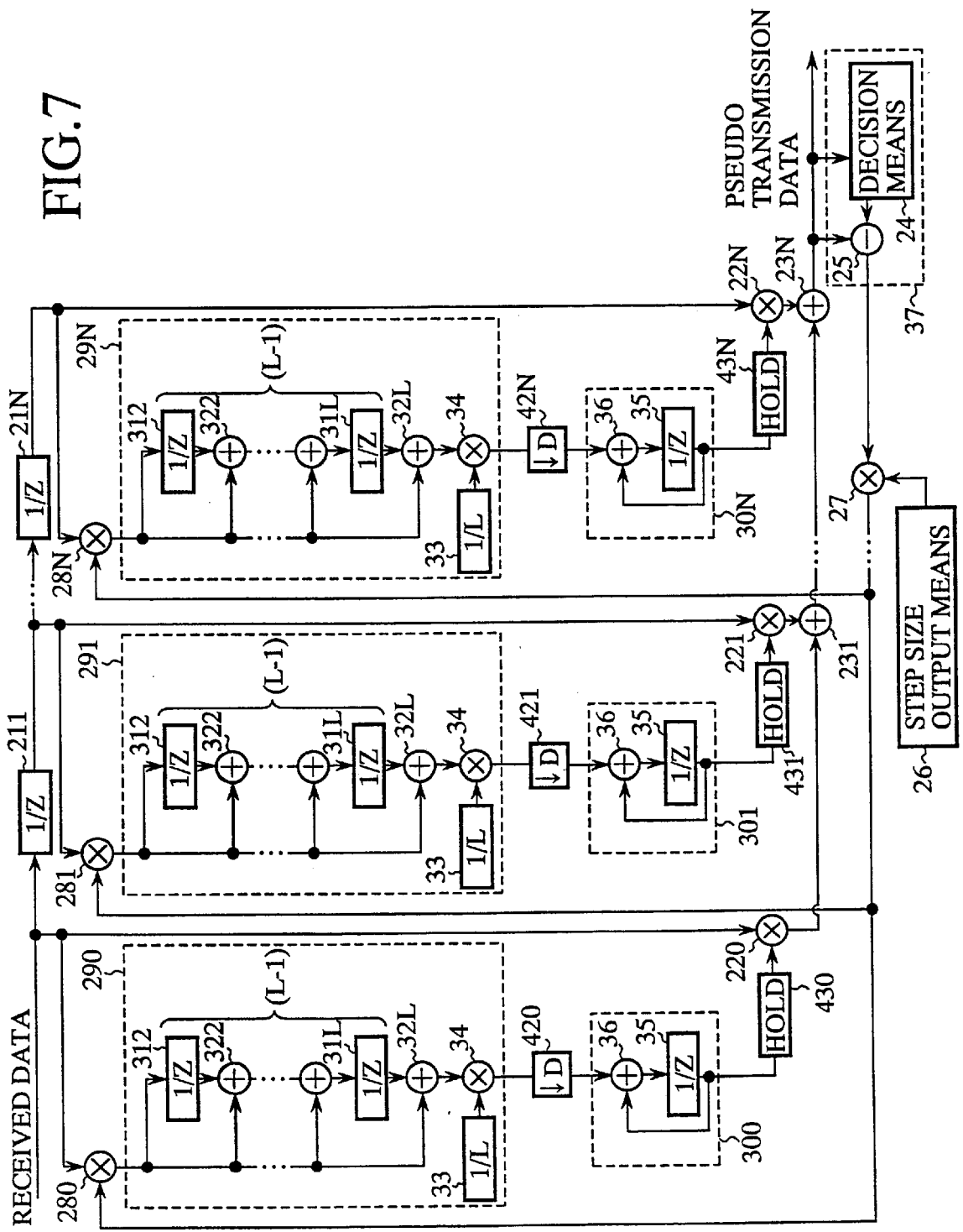
FIG. 7 is a block diagram illustrating the configuration of an adaptive equalizer according to Embodiment 3 of the present invention.

FIG. 7 illustrates in block form the configuration of an adaptive equalizer according to Embodiment 3 of the present invention. In FIG. 7, reference numerals 420, ..., 42N denote decimation circuits, each of which outputs the mean gradient value every D-th (where d is an integer) received data input timing and outputs "0" at the other received data input timing. Reference numerals 430, ..., 43N denote hold circuits, each of which inputs thereinto the tap coefficient every D-th received data input timing and outputs it during the D-th received data input period. The other parts are the same as those in Embodiment 1, and hence they are identified by the same reference numerals and no description will be repeated.

Next, the operation of the adaptive equalizer according to this embodiment will be described.

The operation until the generation of pseudo transmission data from the received data and the operation until the outputting of the instantaneous gradient values from the multipliers 280, ..., 28N in response to the input of received data are the same as those in Embodiment 1; hence, no description will be given of these operations. A description will be made of an operation until the updating of the tap-coefficient based on the instantaneous gradient value.

Each of the decimation circuits 420, ..., 42N, supplied with the instantaneous gradient value, outputs the mean gradient value every D-th (where D {d} is an integer) received data input timing. Accordingly, the output from each decimation circuit 42 is given by the following equation (14):

$$\nabla(m) = (\mu/L) \cdot \sum_{i=1}^{L} e(nD - i) \cdot x(nD - i) \quad @m = nD \\ \nabla(m) = 0 \quad @m \neq nD \quad (14)$$

where m, n and D are integers equal to or greater than 1, $\mu$ is the step size (a real number), L is the number of data added (an integer equal to or greater than 2), e(nD−i) is an error contained in (nD−i)th pseudo transmission data, and x(nD−1) is (nD−i)th received data.

Accordingly, the tap coefficient calculating means 300, ..., 30N, into which the outputs from the decimation circuits 420, ..., 42N, essentially update their outputs every nD-th received data input timing. And, during the nD-th received data input period the tap coefficient calculating means 300, ..., 30N each output the tap coefficient given by the following equation (15):

$$C(nD) = C(nD - D) + (\mu/L) \cdot \sum_{i=1}^{L} e(nD - i) \cdot x(nD - i) \quad (15)$$

where C(nD) and C(nD−D) are tap coefficients, n and D are integers equal to or greater than 1, $\mu$ is the step size (a real number), L is the number of data added (an integer equal to or greater than 2), e(nD−i) is an error contained in (nD−i)th pseudo transmission data, and x(nD−i) is (nD−i)th received data.

The hold circuits 430, ... 43N each hold the tap coefficient input thereinto every D-th received data input timing and output it during the d-th received data input period.

Consequently, the tap coefficient that is provided to each tap coefficient multiplier 22 is updated to the value of Eq. (15) every D-th received data input timing.

in this instance (where D≧2), updating of the tap coefficient is less affected by an instantaneous gradient at each position on the curved surface of the mean square error shown in FIG. 3 and the excess error becomes smaller than in the case of Embodiment 1.

As described above, according to Embodiment 3, the tap coefficient can be varied more precisely than in Embodiment 1, it is possible to generate a pseudo send signal that contains a smaller mean square error than in the case of embodiment 1.

Besides, the circuit scale of this embodiment is substantially the same as that of Embodiment 1, and hence is practical.

Figure 8:
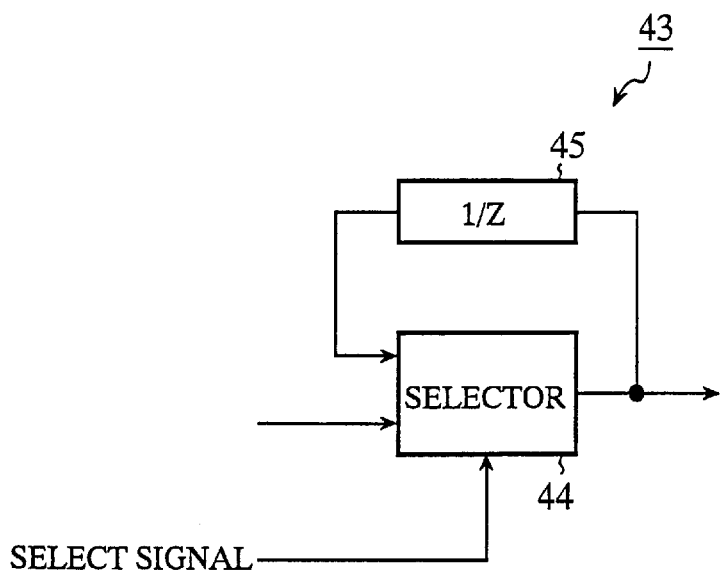
FIG. 8 is a block diagram showing the configuration of a modified form of a hold circuit according to Embodiment 3 of the present invention.

FIG. 8 illustrates an example of the configuration of the hold circuit 43. In FIG. 8, reference numeral 45 denotes a delay line by which the output from the hold circuit is delayed by one received data input period, and 44 a selector circuit which is supplied with the outputs from the delay line 45 and from the tap coefficient calculating means 30 and passes therethrough the two inputs alternately with each other in response to a select signal. By switching the select signal for one received data input period every D-th received data input timing, the hold circuit 43 holds the tap coefficient input thereinto every D-th received data input timing and outputs it during the D-th received data input period.

By generating, under the condition of L<D, the (nD)th pseudo send data based on the (nD)th received data x(xD) through the (nD+D−1)th pseudo send data based on the (nD+D−1)th received data x(nD+D−1), the circuitry for calculating the mean value of tap coefficients can be downsized as compared with that needed under the condition of L=D. Hence, this embodiment is particularly effective in the reduction of the circuit scale.

Figure 9A:
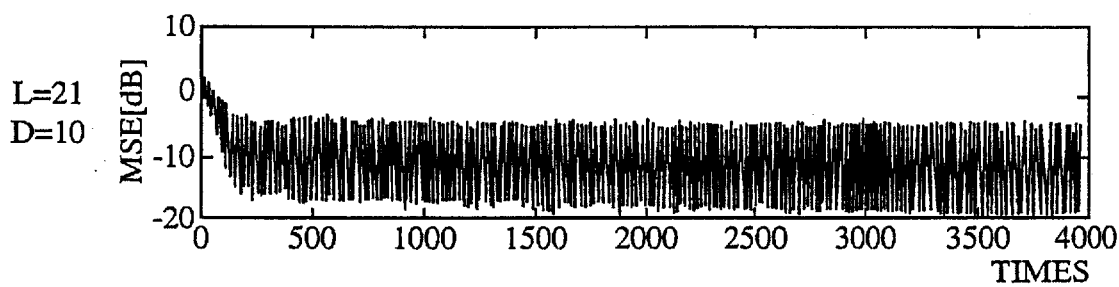
FIGS. 9(a) and 9(b) are diagrams showing error convergence characteristics in the cases where L=21 and D=10 and where L=D=10 in Embodiment 3 of the present invention.
Figure 9B:
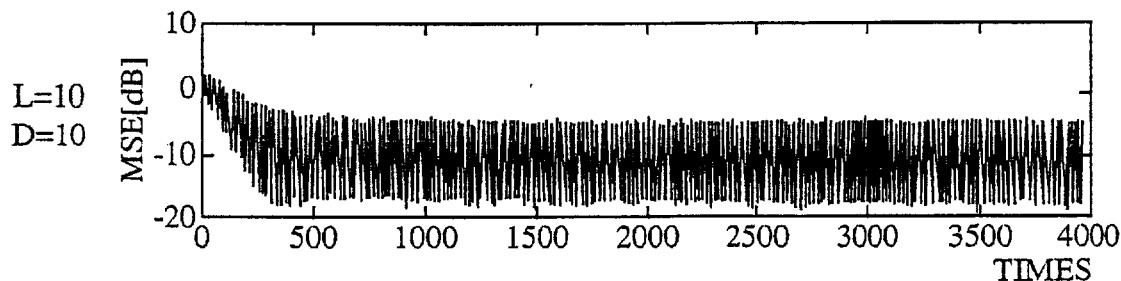

Further, by generating, under the condition of L<D, the (nD)th pseudo send data based on the (nD)th received data x(xD) through the (nD+D−1)th pseudo send data based on the (nD+D−1)th received data x(nD+D−1), the excessive error can be more effectively reduced rather than in the case of generating such pseudo send data under the condition of L=D. FIG. 9(a) and FIG. 9(b) exemplify this; FIG. 9(a) shows the convergence characteristic in the case where L=21 and D=10, and FIG. 9(b) the convergence characteristic in the case where L=D=10. Apparently, the convergence characteristic of FIG. 9(a) permits more effective reduction of the error than in the case of FIG. 9(b).

Figure 10:
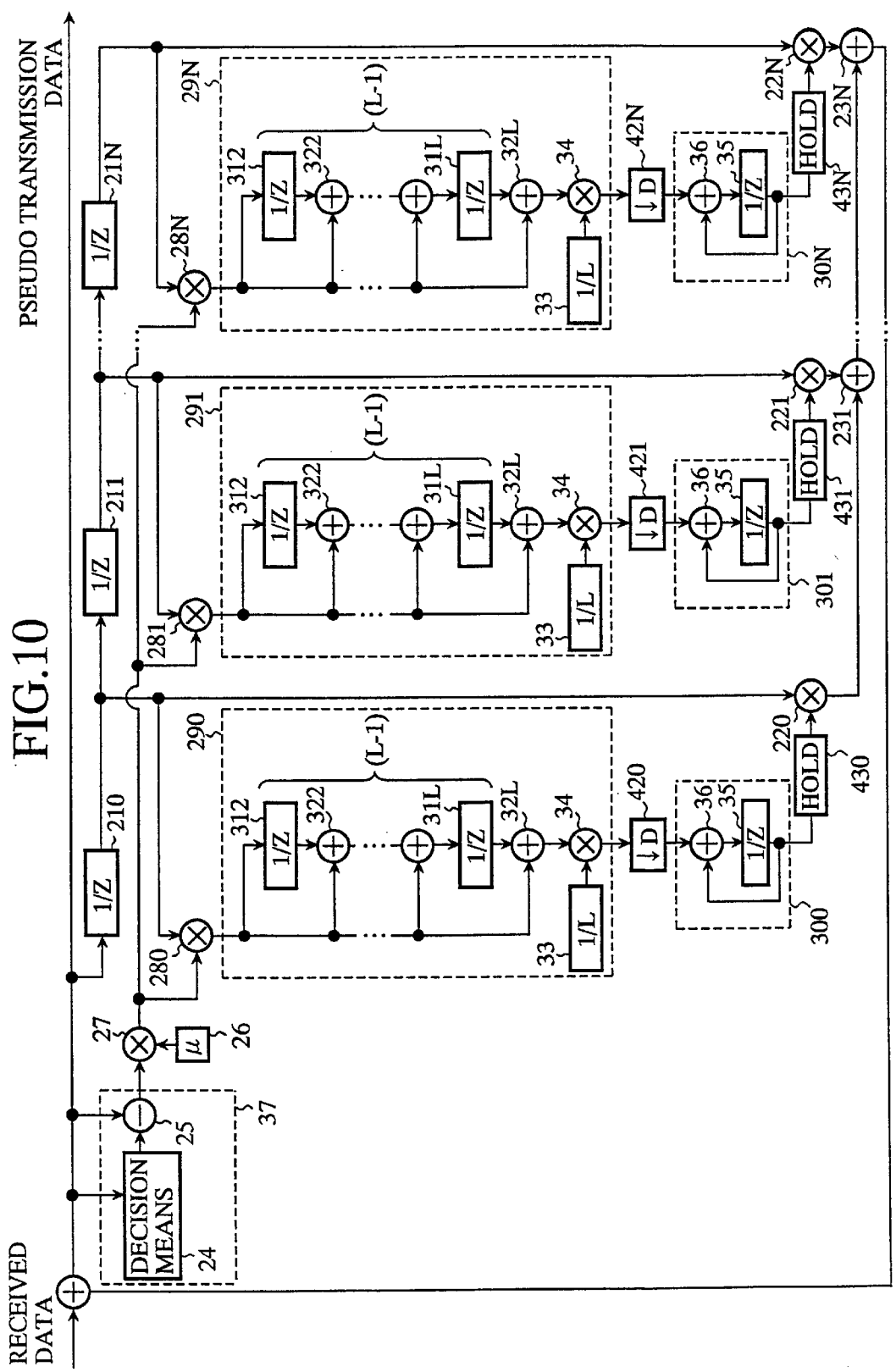
FIG. 10 is a block diagram showing the configuration of a modified form of the adaptive equalizer according to Embodiment 3 of the present invention.

Although Embodiment 3 employs, as the basic configuration, the FIR filter as is the case with embodiment 1, it is needless to say that the effects of the present invention could be expected even if an IIR (infinite impulse Response) filter is used as the basic configuration as is the case with Embodiment 3. in FIG. 10, the respective parts used are identical with those in FIG. 7 and hence are identified by the same reference numerals.

Eqs, (11) and (12) are identical with those obtainable by substituting "1" for "D", "n+1" for "n" and "i+1" for "l" in Eq. (15). Embodiments 1 and 2 are specified versions of Embodiment 3.

Embodiment 4

Figure 11:
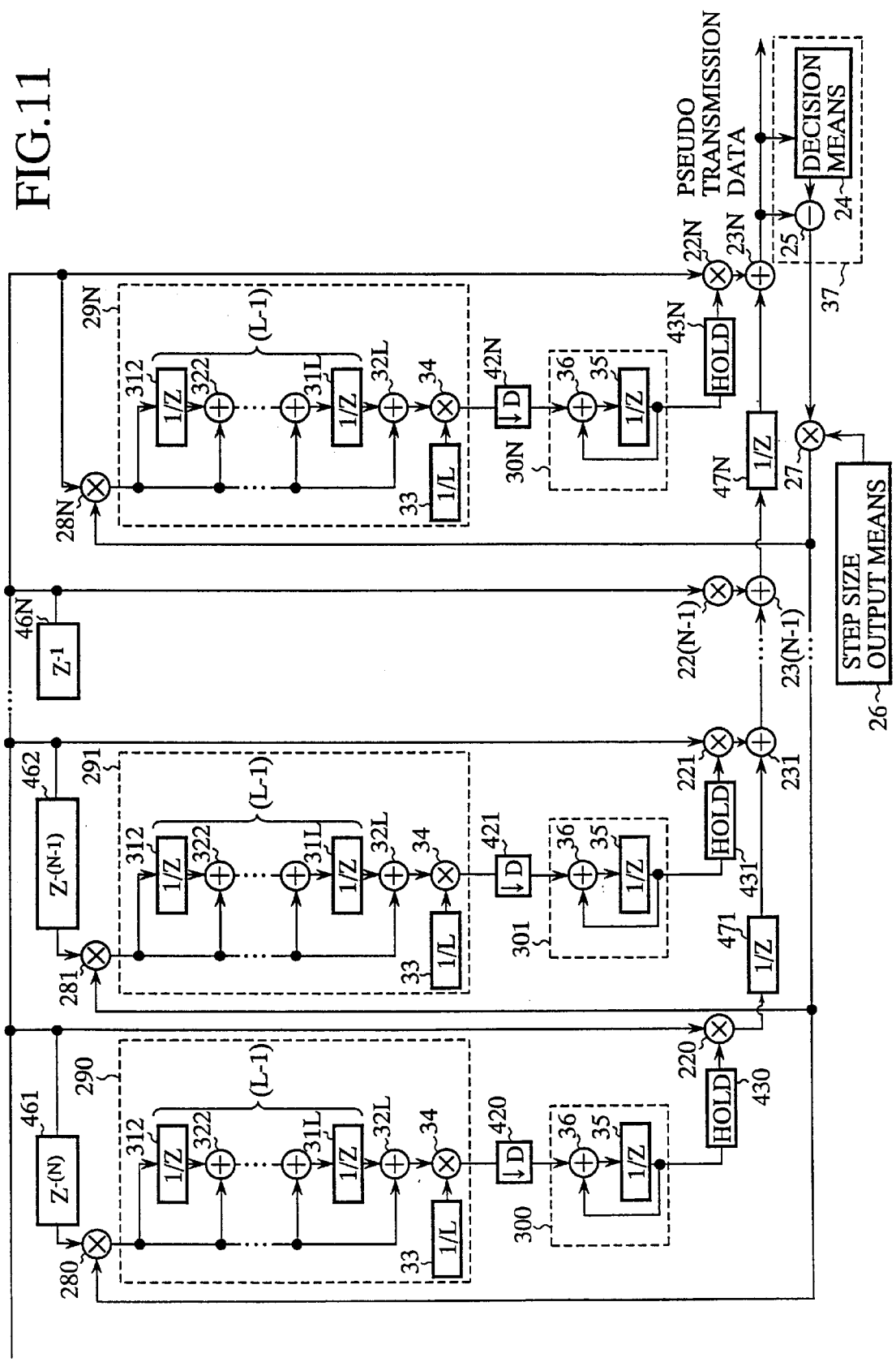
FIG. 11 is a block diagram illustrating the configuration of an adaptive equalizer according to Embodiment 4 of the present invention.

FIG. 11 illustrates in block form the configuration of an adaptive equalizer according to Embodiment 4 of the present invention. In FIG. 11, reference numerals 461, ..., 46N denote N delay lines which are directly supplied with received data and delay it by a time interval N times longer than the received data input period, ..., by a time interval one time the received data input period, respectively, and 471, ..., 47N N delay lines which delay the delay inputs to the adders 231, ..., 23N of the sum-up means for one received data input period. The other parts are the same as those in Embodiment 3 and hence are identified by the same reference numerals, and no description will be given of them. Such a configuration as shown in FIG. 11 is commonly called a transposition filter.

Next, the operation of this embodiment will be described.

This embodiment is basically common in operation to Embodiment 3 and differs only with respect to the points mentioned below.

in the first place, the received data is input into the instantaneous gradient calculating multipliers 280, ..., 28N in order reverse to that in embodiment 3. Accordingly, the tap coefficients that are output from the hold circuits 430, ..., 43N are reverse in order to that in Embodiment 3.

And the tap coefficient multiplying means 220, ..., 22N multiplies the finally input received data by the tap coefficients and output the multiplied values, respectively.

Finally, the sum-up means (23N) adds together all the pieces of multiplied data while delaying each of them by one period.

Hence, the summed-up data that is provided from the adder 23N of the last stage is the sum total of the received data last input and multiplied by the tap coefficient, the received data input one period before and multiplied by the tap coefficient, ... and the received data input N periods before and multiplied by the tap coefficient; the summed-up data has about the same value as in Embodiment 3.

As described above, Embodiment 4 produces the same effects as does Embodiment 3.

The adaptive equalizer 5 using the direct filer according to Embodiment 4 differs from the equalizer 5 of Embodiment 3 only in that the tap coefficient multiplying means 2N and the adder 23N are connected between the received data input terminal and the pseudo transmission data output terminal. Further, delay lines are each connected between multiplied data adders for adding together the results of calculation by the ladders. With such a configuration, when the same elements as those in Embodiment 3 are used, the ratio of the processing time to the received data input cycle period rises, allowing more time to perform the processing. This permits the use of slow-acting elements of low power consumption or enables speeding-up of data transmission by reducing the received data input cycle accordingly.

Moreover, since the delay lines are each connected between the multiplied data adders for adding together the results of calculation by the ladders, delays develop in obtaining the output from the adaptive equalizer based on the coefficients provided from the tap coefficient calculating means 300, ..., 30N−1. Accordingly, in the case where D=1 and the tap coefficient is updated every data input cycle in Embodiment 4, the tap coefficient will be updated iteratively prior to the production of pseudo send data outputs based on the updated tap coefficient, making it difficult for errors to converge or increasing the excessive error remaining unremoved. it is preferable, therefore, to set D≧2. By this, the tap coefficient updating interval is lengthened, close to the time interval during which to yield the pseudo send data output based on the updated tap coefficient—this facilitates convergence of errors and permits reduction of the excessive errors remaining unremoved accordingly.

Embodiment 5

Figure 12:
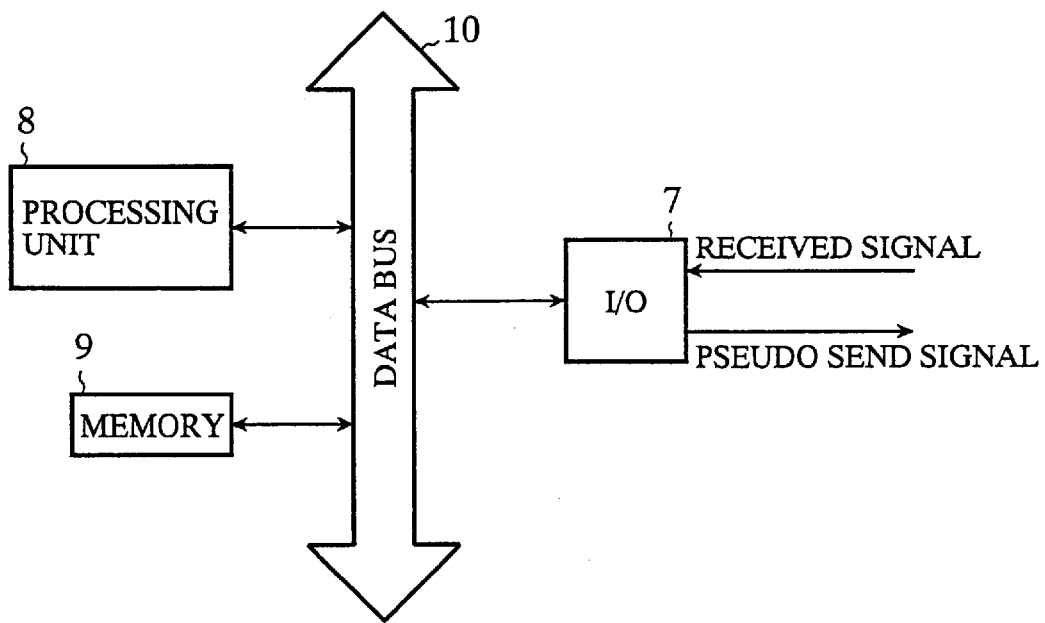
FIG. 12 is a block diagram illustrating the configuration of an adaptive equalizer according to Embodiment 5 of the present invention.
Figure 15:
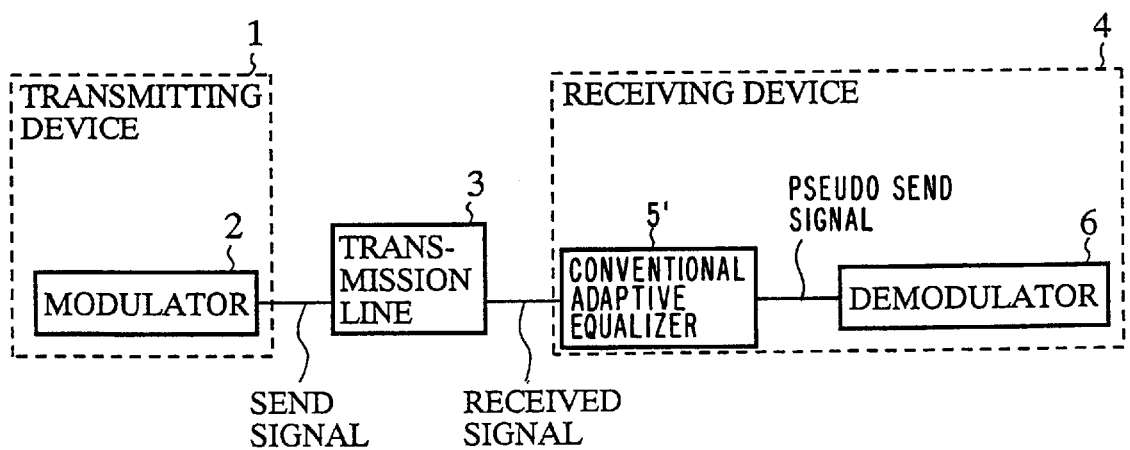
FIG. 15 is a block diagram illustrating the configuration of a conventional data transmission system.

FIG. 12 illustrates in block form the configuration of an adaptive equalizer according to Embodiment of the present invention. In FIG. 12, reference numeral 7 denotes an I/O port into which the received signal is input and from which the pseudo send signal is output, 8 a processing unit which, for each received data of the received signal, performs predetermined adaptive equalization to generate pseudo transmission data, 9 a memory for storing an adaptive equalization program and various data for use by the processing unit 8, and 10 a data bus through which the i/O port 7, the processing unit 8 and the memory 9 are connected for data transmission and reception between them.

Figure 13:
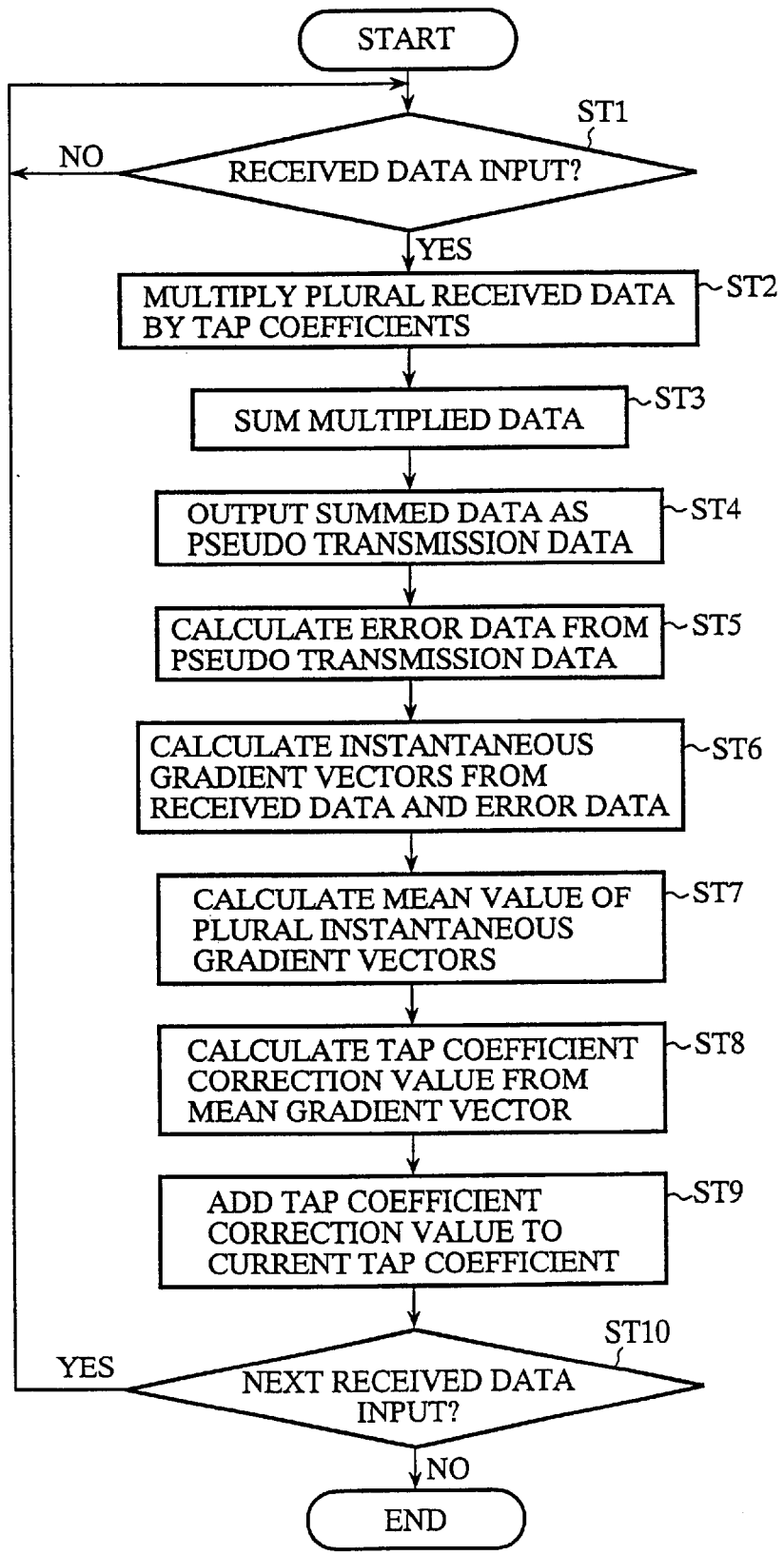
FIG. 13 is a flowchart showing an adaptive equalization program according to Embodiment 5 of the present invention.
Figure 16:
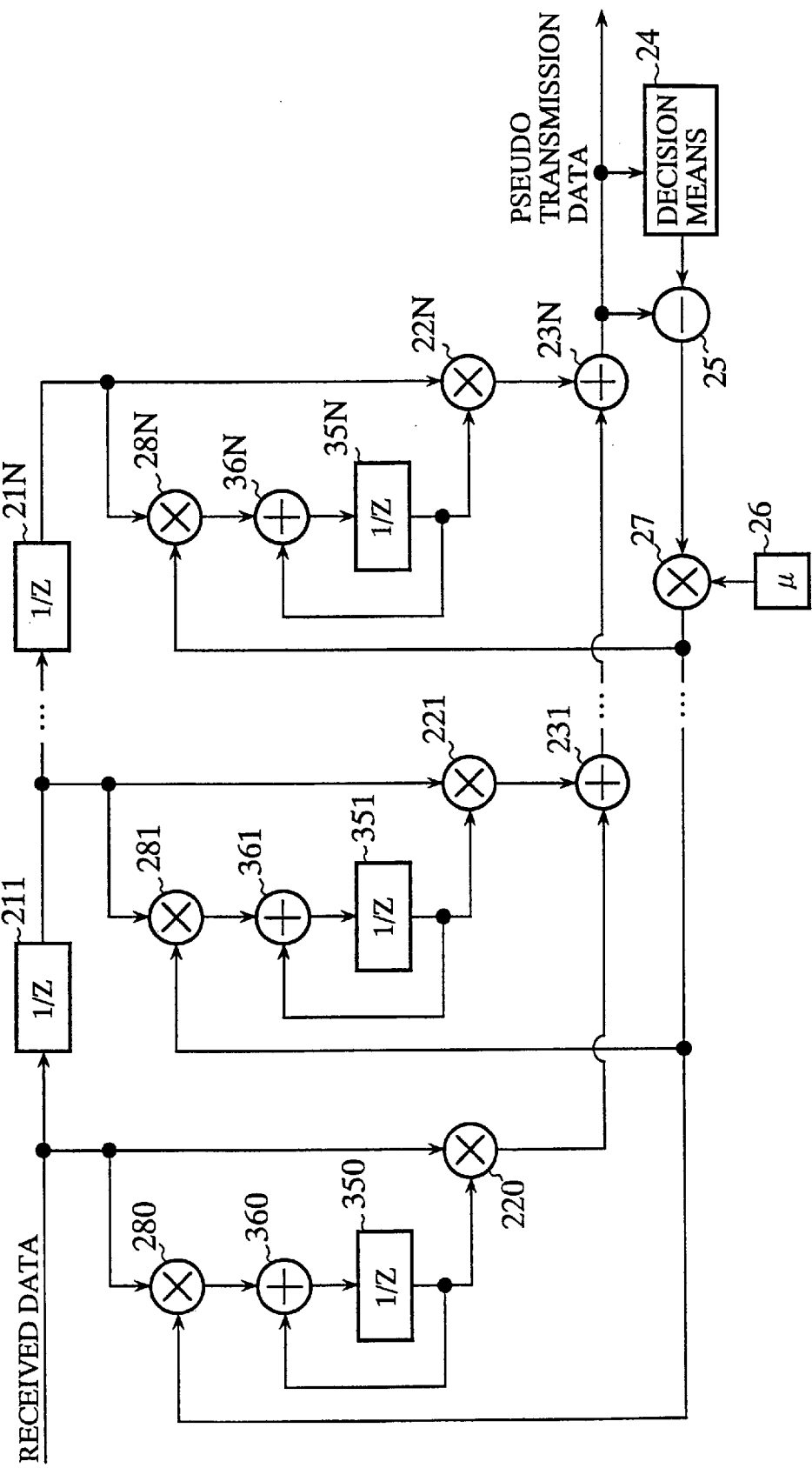
FIG. 16 is a block diagram showing an example of the configuration of a conventional adaptive equalizer.

FIG. 13 is a flowchart showing the flow of the above-mentioned adaptive equalization. In FIG. 11, step ST1 is a step of waiting for the input of the first received data; step ST2 is a step wherein upon input of received data, plural pieces of received data input so far are each multiplied by the tap coefficient; step ST3 is a step of summing up the plural pieces of multiplied data; step ST4 is a step of outputting the summed-up data as pseudo transmission data via the i/O port 7; step ST5 is a step of making a soft or hard decision based on the pseudo transmission data to estimate the transmission line characteristic and calculating error data contained in the pseudo transmission data on the basis of the estimated transmission line characteristic; step ST6 is a step of multiplying each pieces of the received data by the error data to calculate the instantaneous gradient vector; step ST7 is a step of calculating the mean value of the plural instantaneous gradients; step ST8 is a step of multiplying the mean gradient vector by the step size to obtain a tap coefficient correction value; step ST9 is a step of accumulating the tap coefficient correction value and outputting the accumulated value as the updated tap coefficient; and step ST10 is a step of determining if the next received data is input.

With such an arrangement, too, it is possible to obtain the tap coefficient of the value given by Eq. (15). The tap coefficient is iteratively updated and the likelihood of the pseudo transmission data gradually increases.

As described above, according to Embodiment 5, since the (nd)th pseudo transmission data based on the (nD)th received data x(nD) through the (nD+D−1)th pseudo transmission data based on the (nD+D−1)th received data x(nD+D−1) are generated using the tap coefficient calculated from Eq. (15), the excess error contained in the pseudo transmission data is 1/L (where L is an integer equal to or greater than 2) that contained in the pseudo transmission data based on the conventional LMS algorithm. Thus, it is possible to create a pseudo send signal that contains mean square errors fewer than those in the pseudo send signal based on the conventional LMS algorithm.

The circuitry of the adaptive equalizer according to Embodiment 1 differs from the circuitry for the conventional LMS algorithm only in that the former has, for each tap, a circuit for calculating the mean value of gradient vectors based on L instantaneous values; therefore, the adaptive equalization program for use in embodiment 5 can be implemented with a little larger number of steps than that for the program based on the LMS algorithm, that is, with a practical number of steps.

Hence, the adaptive equalizer according to Embodiment 5 will enhance the quality of data when employed in a data transmission system or receiving device.

Moreover, the condition of L<D permits effective reduction of the circuit scale, whereas the condition of L>D permits effective reduction of the excess error.

Embodiment 6

An adaptive equalizer according to Embodiment 6 of the present invention is identical in construction with the adaptive equalizer according to Embodiment 3; hence, no description will repeated.

FIG. 14 is a flowchart showing the flow of the adaptive equalization of this embodiment. In FIG. 12, step ST11 is a step of waiting for the input of first received data; step ST12 is a step wherein, upon input of received data, adding thereto a received data correction value; step ST13 is a step of outputting the added data as pseudo transmission data via the i/O port 7; step ST14 is a step of making a soft or hard decision based on the pseudo transmission data to estimate the transmission line characteristic and calculating error data contained in the pseudo transmission data on the basis of the estimated transmission line characteristic; step 15 is a step of multiplying the pseudo transmission data by the error data to calculate the instantaneous gradient vector; step ST16 is a step of calculating the mean value of plural instantaneous gradient vectors; step 17 is a step of calculating the tap coefficient correction value based on the mean gradient vector; step ST18 is a step of accumulating the tap coefficient correction value and outputting the accumulated value as the tap coefficient; and step ST21 is a step of determining if the next received data is input.

With such an arrangement, too, it is possible to obtain the tap coefficient of the value given by Eq. (15). The tap coefficient is iteratively updated and the likelihood of the pseudo transmission data gradually increases.

As described above, according to Embodiment 6, since the (nD)th pseudo transmission data based on the (nD)th received data x(nD) through the (nD+D−1)th pseudo transmission data based on the (nD+D−1)th received data x(nD+D−1) are generated using the tap coefficient calculated from Eq. (15), the excess error contained in the pseudo transmission data is 1/L (where L is an integer equal to or greater than 2) that contained in the pseudo transmission data based on the conventional LMS algorithm as indicated by Eq. (10). Thus, it is possible to create a pseudo send signal that contains the mean square error smaller than that in the pseudo send signal based on the conventional LMS algorithm.

The circuitry of the adaptive equalizer according to Embodiment 1 differs from the circuitry for the conventional LMS algorithm only in that the former has, for each tap, a circuit for calculating the mean value of gradient vectors based on L instantaneous values; therefore, the adaptive equalization program for use in embodiment 6 can be implemented with a little larger number of steps than that for the program based on the LMS algorithm, that is, with a practical number of steps.

Hence, the adaptive equalizer according to Embodiment 6 will enhance the quality of data when employed in a data transmission system or receiving device.

Moreover, the condition of L<D permits effective reduction of the circuit scale, whereas the condition of L>D permits effective reduction of the excess error.

The above-described preferred embodiments of the present invention should be construed as being merely illustrative of the invention but not as limiting the invention thereto, and it is to be understood that many modifications and variations may be effected without departing from the scope of spirits of the claims appended hereto.

What is claimed is:

1. An adaptive equalization method of generating a pseudo send electrical signal composed of pieces of pseudo transmission electrical data, from a received electrical signal composed of plural pieces of received electrical data, to thereby reduce noise and signal distortion components in the received signal, comprising:

receiving the signal composed of plural pieces of received data; and generating (nD)th pseudo transmission data based on (nD)th received data x(nD) through (nD+D−1)th pseudo transmission data based on (nD+D−1)th received data x(nD+D−1), under the condition of L<D, by using a tap coefficient C(nD) calculated by the following equation:

$$C(nD) = C(nD - D) + (\mu/L) \cdot \sum_{i=1}^{L} e(nD - i) \cdot x(nD - i)$$

where C(nD) and C(nD−D) are tap coefficients used to generate nth pseudo send data, n and D being integers equal to or grater than 1, $\mu$ is a step size, which is a real number, L is the number of data added, which is an integer equal to or greater than 2, e(nD−i) is an error contained in (nD−i)th pseudo transmission data and x(nD−i) is (nD−i)th received data.

2. An adaptive equalization method of generating a pseudo electrical send signal composed of pieces of pseudo transmission electrical data, from a received electrical signal composed of plural pieces of received electrical data, to thereby reduce noise and signal distortion components in the received signal, comprising:

receiving the signal composed of plural pieces of received data; and generating (nD)th pseudo transmission data based on (nD)th received data x(nD) to (nD+D−1)th pseudo transmission data based on (nD+D−1)th received data x(nD+D−1), under the condition of L>D, by using a tap coefficient C(nD) calculated by the following equation:

$$C(nD) = C(nD - D) + (\mu/L) \cdot \sum_{i=1}^{L} e(nD - i) \cdot x(nD - i)$$

where C(nD) and C(nD−D) are tap coefficients, n and D are integers equal to or greater than 1, and L is integers, $\mu$ is the step size, which is a real number, L is the number of data added, which is an integer equal to or greater than 2, e(nD−i) is an error contained in (nD−i)th pseudo transmission data, and x(nD−i) is (nD−i)th received data.

* * * * *